United States Patent
Mizuno et al.

(10) Patent No.: US 6,853,019 B2
(45) Date of Patent: Feb. 8, 2005

(54) SEMICONDUCTOR DEVICE AND MANUFACTURING METHOD FOR THE SAME

(75) Inventors: Masaharu Mizuno, Kanagawa (JP); Shigeo Noda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 28 days.

(21) Appl. No.: 10/437,391

(22) Filed: May 14, 2003

(65) Prior Publication Data

US 2003/0214320 A1 Nov. 20, 2003

(30) Foreign Application Priority Data

May 17, 2002 (JP) ........................... 2002-143517

(51) Int. Cl.[7] .............................. H10L 27/10
(52) U.S. Cl. .............. 257/207; 257/208; 257/210; 257/211; 365/63; 365/174
(58) Field of Search ................... 257/208, 207, 257/210, 211; 438/597, 599; 365/63, 174

(56) References Cited

U.S. PATENT DOCUMENTS

| | | | |
|---|---|---|---|
| 4,910,417 A | | 3/1990 | El Gamal et al. |
| 5,055,718 A | | 10/1991 | Galbraith et al. |
| 5,243,208 A | * | 9/1993 | Isomura et al. ............ 257/205 |
| 5,646,558 A | | 7/1997 | Jamshidi |
| 5,684,412 A | | 11/1997 | Yoeli et al. |
| 5,898,636 A | * | 4/1999 | Isomura et al. ............ 257/210 |
| 5,920,089 A | * | 7/1999 | Kanazawa et al. .......... 257/207 |
| 5,955,912 A | | 9/1999 | Ko |
| 6,014,038 A | | 1/2000 | How et al. |
| 6,020,772 A | | 2/2000 | Hayashi et al. |
| 6,278,148 B1 | * | 8/2001 | Watanabe et al. ........... 257/208 |
| 6,356,118 B1 | | 3/2002 | Rikino et al. |
| 6,396,087 B1 | * | 5/2002 | Kitabayashi et al. ........ 257/207 |
| 6,674,307 B2 | | 1/2004 | Mizuno |
| 2002/0047727 A1 | | 4/2002 | Mizuno |
| 2003/0201798 A1 | | 10/2003 | Mizuno |

FOREIGN PATENT DOCUMENTS

| | | |
|---|---|---|
| JP | 02-222217 A | 9/1990 |
| JP | 09-116124 A | 5/1997 |
| JP | 09-148916 A | 6/1997 |
| JP | 10-223902 A | 8/1998 |
| JP | 2000-319269 | 10/2000 |
| JP | 2001-523048 A | 11/2001 |
| TW | 308696 | 6/1997 |
| WO | WO 99/25023 A1 | 5/1999 |

OTHER PUBLICATIONS

U.S. Appl. No. 10/438,012 (projected publication date Nov. 20, 2003).

* cited by examiner

*Primary Examiner*—Michael Tokar
*Assistant Examiner*—Lam T. Mai
(74) *Attorney, Agent, or Firm*—Sughrue Mion, PLLC

(57) ABSTRACT

A semiconductor device includes a plurality of logic cells formed on a semiconductor substrate, wherein each of the plurality of logic cells has a circuit for a function block of a logic circuit; and a wiring layer which connects the plurality of logic cells to form the logic circuit function blocks and thereby the logic circuit. The wiring layer includes a power supply wiring line pattern formed in a region corresponding to each of the plurality of logic cells; a ground wiring line pattern formed in the region; and a plurality of terminal patterns formed in the region. Each of the plurality of terminal patterns is connected with the circuit of the logic cell, and the plurality of terminal patterns are arranged adjacent to at least one of the power supply wiring line pattern and the ground wiring line pattern.

11 Claims, 4 Drawing Sheets

SEMICONDUCTOR DEVICE AND MANUFACTURING METHOD FOR THE SAME

BACKGROUND OF THE INVENTION

1. Field of the Invention

The present invention relates to a semiconductor device and a manufacturing method for the same.

2. Description of the Related Art

Conventionally, a logic cell array is known. In the logic cell array, a plurality of cells are arranged in an array in a lower layer, and a wiring layer is formed on the lower layer to connect the plurality of cells and thereby to form a logic circuit. Thus, a semiconductor device can be manufactured to have a desired function. In one of such logic cell arrays, logic cells having functional blocks such as a multiplexer, a flip-flop, and an inverter are arranged.

Figure 1:
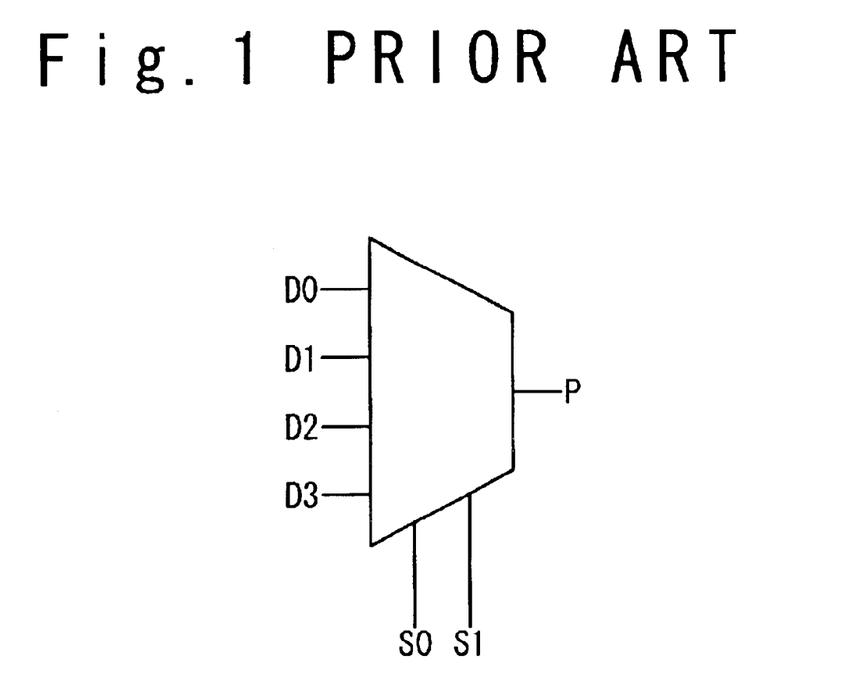
FIG. 1 is a diagram showing a logic symbol of a conventional logic cell.

For example, in Japanese Laid Open Patent application (JP-P2001-523048A corresponding to WO99/25023) is disclosed ASIC wiring architecture, in which various IC devices are mutually connected to form a customized circuit. FIG. 1 is a logic notation showing a circuit of a logic cell disclosed in that conventional example. The logic cell is composed of a 4-input and 1-output multiplexer. The multiplexer has four data input terminals D0, D1, D2 and D3, two selection terminals S0 and S1 and one output terminal P.

Figure 2:
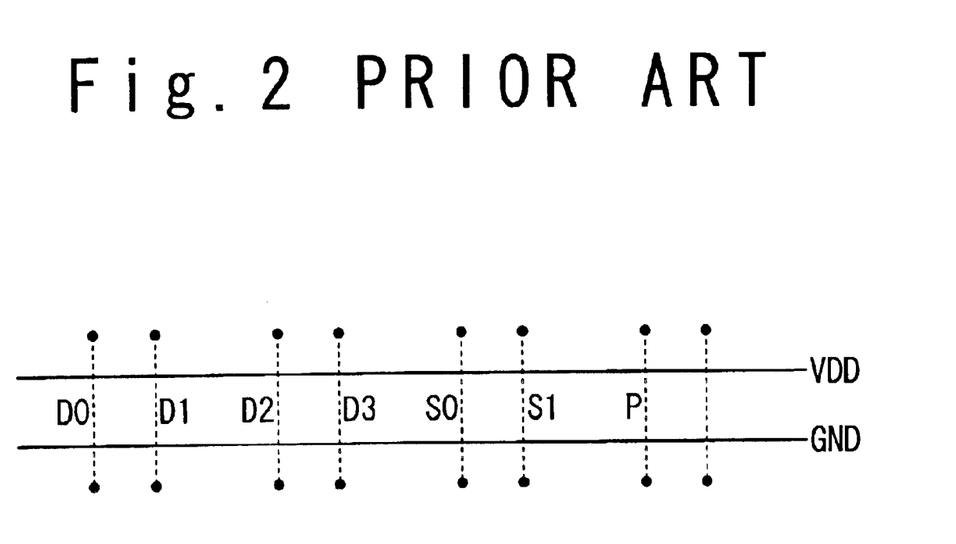
FIG. 2 is a diagram showing an arrangement of a power supply wiring line pattern, a ground wiring line pattern and terminals in the conventional logic cell.

FIG. 2 shows the arrangement of each terminal of the logic cell. Each of the terminals D0, D1, D2, D3, S0, S1 and P is composed of a pair of terminals (vias), between which a power supply wiring line pattern VDD and a ground wiring line pattern GND are put. Each pair of terminals is provided in parallel to the power supply wiring line pattern VDD and the ground wiring line pattern GND, and the terminals of each pair have the same potential.

In the above-described conventional logic cell, some of the input terminals D0, D1, D2, D3, S1 and S2 are connected with the power supply wiring line pattern VDD or the ground wiring line pattern GND in order to realize a desired logical function. For this reason, the two terminals with the same potential are provided on either side of the power supply wiring line pattern VDD and the ground wiring line pattern GND, as described above. Two horizontal tracks are occupied irrespective of the use/non-use of the terminals in the logic cell.

Also, the logic cell has only the terminals necessary to realize a multiplexer function. Therefore, the logic circuit to be realized using the multiplexer is limited.

Moreover, the positions for the terminals to be arranged are not especially considered. For this reason, it is required to provide a bypass wiring line pattern except for a case to apply the same potential to the adjacent input terminals. Therefore, the wiring line pattern to form the logic cell for a desired logical function becomes complicated. As a result, the wiring line area between the logic cells is restricted and causes the deterioration of the electric characteristic and the workability of wiring line through the bypassing of the wiring line.

SUMMARY OF THE INVENTION

Therefore, an object of the present invention is to provide a semiconductor device in which wiring workability and electric characteristic of a semiconductor chip can be improved, and a manufacturing method for the same.

In an aspect of the present invention, a semiconductor device includes a plurality of logic cells formed on a semiconductor substrate, wherein each of the plurality of logic cells has a circuit for a function block of a logic circuit; and a wiring layer which connects the plurality of logic cells to form the logic circuit function blocks and thereby the logic circuit. The wiring layer includes a power supply wiring line pattern formed in a region corresponding to each of the plurality of logic cells; a ground wiring line pattern formed in the region; and a plurality of terminal patterns formed in the region. Each of the plurality of terminal patterns is connected with the circuit of the logic cell, and the plurality of terminal patterns are arranged adjacent to at least one of the power supply wiring line pattern and the ground wiring line pattern.

Here, the plurality of terminal patterns may include signal input terminal patterns, one or more of which are selectively opened depending on the logic circuit function block to be formed. The wiring layer further may include a pattern connecting each of remaining ones of the signal input terminal patterns to one of the power supply wiring line pattern, the ground wiring line pattern and another of the remaining signal input terminal patterns, depending on the logic circuit function block to be formed.

Also, ones of the plurality of terminal patterns to be connected each other depending on the logic circuit function block to be formed may be arranged adjacent to each other.

Also, ones of the plurality of terminal patterns to be connected with the power supply wiring line pattern depending on the logic circuit function block to be formed may be arranged adjacent to the power supply wiring line pattern.

Also, ones of the plurality of terminals to be connected with the ground wiring line pattern depending on the logic circuit function block to be formed may be arranged adjacent to the ground wiring line pattern.

Also, the logic cell may have a multi-purpose circuit as the circuit. In this case, the multi-purpose circuit may include first to third inverters and first and second transfer gates. In the first inverter, an input is connected with a first terminal pattern of the plurality of terminal patterns, and an output is connected with a second terminal pattern of the plurality of terminal patterns. In the second inverter, an input is connected with a third terminal pattern of the plurality of terminal patterns and an output is connected with a fourth terminal pattern of the plurality of terminal patterns. In the third inverter, an input is connected with a fifth terminal pattern of the plurality of terminal patterns. In the first transfer gate, an input is connected with the output of the first inverter, a first control terminal is connected with the input of the third inverter and a second control terminal is connected to an output of the third inverter. In the second transfer gate, an input is connected with the output of the second inverter, a first control terminal is connected with the output of the third inverter and a second control terminal is connected to the input of the third inverter. An output of the first transfer gate and an output of the second transfer gate are connected to a sixth terminal pattern of the plurality of terminal patterns.

In this case, the power supply wiring line pattern may include a first power supply wiring line pattern and a second power supply wiring line pattern. The first terminal and the fourth terminal may be arranged between the first power supply wiring line pattern and the ground wiring line pattern, the second terminal and the third terminal may be arranged between the ground wiring line pattern and the second power supply wiring line pattern, and the fifth terminal and the sixth terminal may be arranged between the second power supply wiring line pattern and an edge portion of the region.

In this case, a NAND circuit may be formed in which the first terminal pattern is connected with the ground wiring line pattern, and the second terminal pattern and the fourth terminal pattern have no connection such that the third terminal pattern and the fifth terminal pattern are set as inputs and the sixth terminal pattern is set as an output.

Also, a NOR circuit may be formed in which the third terminal pattern is connected with the second power supply wiring line pattern, and the second terminal pattern and the fourth terminal pattern have no connection such that the first terminal pattern and the fifth terminal pattern are set as inputs and the sixth terminal pattern is set as an output.

Also, an EXOR circuit may be formed in which the first terminal pattern is connected with the fourth terminal pattern, and the second terminal pattern has no connection such that the third terminal pattern and the fifth terminal pattern are set as inputs and the sixth terminal is set as an output.

Also, an EXNOR circuit may be formed in which the second terminal pattern is connected with the third terminal pattern, and the fourth terminal pattern has no connection such that the first terminal pattern and the fifth terminal pattern are set as inputs and the sixth terminal pattern is set as an output.

In another aspect of the present invention, a method of manufacturing a semiconductor device may be achieved by forming MOS transistors for each of cells on a semiconductor substrate; by forming a lower wiring line layer to produce a multi-purpose circuit for the cell by connecting the MOS transistors by the lower wiring line layer; and by forming an upper wiring line layer to produce a logic circuit for the cells by connecting the multi-purpose circuits by the upper wiring line layer.

Here, the step of forming an upper wiring line layer may be achieved by forming a power supply wiring line pattern in a region of the cell; by forming a ground wiring line pattern in the region; and by forming a plurality of terminal patterns formed in the region. Each of the plurality of terminal patterns is connected with the multi-purpose circuit of the cell, and the plurality of terminal patterns are arranged adjacent to at least one of the power supply wiring line pattern and the ground wiring line pattern.

Also, the plurality of terminal patterns may include signal input terminal patterns, one or more of which are selectively opened depending on the logic circuit to be formed. In this case, the step of forming an upper wiring line layer may include: forming a pattern connecting each of remaining ones of the signal input terminal patterns to one of the power supply wiring line pattern, the ground wiring line pattern and another of the remaining signal input terminal patterns, depending on the logic circuit function block to be formed.

Also, the step of forming an upper wiring line layer may include: arranging adjacent to each other, ones of the plurality of terminal patterns to be connected each other depending on the logic circuit to be formed.

Also, the step of forming an upper wiring line layer may include: arranging adjacent to the power supply wiring line pattern, ones of the plurality of terminal patterns to be connected with the power supply wiring line pattern depending on the logic circuit to be formed.

Also, the step of forming an upper wiring line layer may include: arranging adjacent to the ground wiring line pattern, ones of the plurality of terminals to be connected with the ground wiring line pattern depending on the logic circuit function block to be formed.

Also, the multi-purpose circuit may include: Also, the logic cell may have a multi-purpose circuit as the circuit. In this case, the multi-purpose circuit may include first to third inverters and first and second transfer gates. In the first inverter, an input is connected with a first terminal pattern of the plurality of terminal patterns, and an output is connected with a second terminal pattern of the plurality of terminal patterns. In the second inverter, an input is connected with a third terminal pattern of the plurality of terminal patterns and an output is connected with a fourth terminal pattern of the plurality of terminal patterns. In the third inverter, an input is connected with a fifth terminal pattern of the plurality of terminal patterns. In the first transfer gate, an input is connected with the output of the first inverter, a first control terminal is connected with the input of the third inverter and a second control terminal is connected to an output of the third inverter. In the second transfer gate, an input is connected with the output of the second inverter, a first control terminal is connected with the output of the third inverter and a second control terminal is connected to the input of the third inverter. An output of the first transfer gate and an output of the second transfer gate are connected to a sixth terminal pattern of the plurality of terminal patterns.

Also, the step of forming an upper wiring line layer may be achieved by forming a first power supply wiring line pattern and a second power supply wiring line pattern as the power supply wiring line pattern, by arranging the first terminal and the fourth terminal between the first power supply wiring line pattern and the ground wiring line pattern, by arranging the second terminal and the third terminal between the ground wiring line pattern and the second power supply wiring line pattern, and by arranging the fifth terminal and the sixth terminal between the second power supply wiring line pattern and an edge portion of the region.

In this case, the step of forming an upper wiring line layer may be achieved by forming a NAND circuit in which the first terminal pattern is connected with the ground wiring line pattern, and the second terminal pattern and the fourth terminal pattern have no connection such that the third terminal pattern and the fifth terminal pattern are set as inputs and the sixth terminal pattern is set as an output.

Also, the step of forming an upper wiring line layer may be achieved by forming a NOR circuit in which the third terminal pattern is connected with the second power supply wiring line pattern, and the second terminal pattern and the fourth terminal pattern have no connection such that the first terminal pattern and the fifth terminal pattern are set as inputs and the sixth terminal pattern is set as an output.

Also, the step of forming an upper wiring line layer may be achieved by forming an EXOR circuit in which the first terminal pattern is connected with the fourth terminal pattern, and the second terminal pattern has no connection such that the third terminal pattern and the fifth terminal pattern are set as inputs and the sixth terminal is set as an output.

Also, the step of forming an upper wiring line layer may be achieved by forming an EXNOR circuit in which the second terminal pattern is connected with the third terminal pattern, and the fourth terminal pattern has no connection such that the first terminal pattern and the fifth terminal pattern are set as inputs and the sixth terminal pattern is set as an output.

DESCRIPTION OF THE PREFERRED EMBODIMENTS

Hereinafter, a semiconductor device of the present invention will be described in detail with reference to the attached drawing.

In a semiconductor device with a logic circuits designed by a user, a logic cell array is formed on a semiconductor substrate. The logic cell array is composed of basic circuits called logic cells arranged in an array, and each logic cell is composed of MOS transistors. The logic cell is formed by electrically connecting the MOS transistors by a lower wiring line layer of three layers, for example. The logic circuit designed by the user is realized by forming an upper or customized wiring line layer on the lower wiring line layer to electrically connect the logic cells. The upper wiring line layer is composed of two layers, for example. Thus, a semiconductor device with the logic circuit designed by the user is manufactured.

Figure 4:
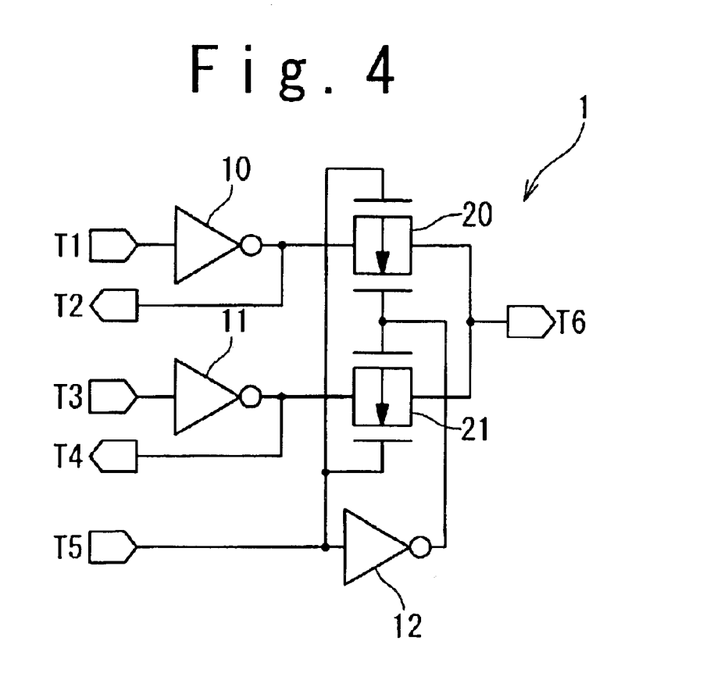
FIG. 4 is a circuit diagram showing the structure of a logic cell used in the semiconductor device according to the embodiment of the present invention.

FIG. 4 is a circuit diagram showing the circuit structure of a logic cell according to an embodiment of the present invention. The logic cell has an inverted output type 2-input multiplexer 1 as a multi-purpose circuit, which is provided with inverters at the first stage, and with transfer gates at the second stage. The logic cell is composed of six terminals such as a first terminal T1, a second terminal T2, a third terminal T3, a fourth terminal T4, a fifth terminal T5 and a sixth terminal T6, and five logic elements such as a first inverter 10, a second inverter 11, a third inverter 12, a first transfer gate 20 and a second transfer gate 21.

Each of the first to third inverters 10 to 12 has the well-known structure in which an N channel MOS transistor and a P channel MOS transistor are connected between the power supply line and the ground in serial. Each of the first to third inverters 10 to 12 inverts an input signal and outputs the inversion result. Each of the first to third inverters 10 to 12 is formed from MOS transistors with a small size to decrease an input capacity.

Also, each of the first and second transfer gates 20 and 21 has a structure in which an N channel MOS transistor and a P channel MOS transistor are connected in parallel, i.e., a structure in which the drains are connected and the sources are connected. Each of the first and second transfer gates 20 and 21 passes a signal supplied to an input terminal or prevents the passage of the signal in accordance with signals supplied to the gate of the N channel MOS transistor and the gate of the P channel MOS transistor. In the following description, the gate of the P channel MOS transistor is called a first control input terminal and the gate of the N channel MOS transistor is called a second control input terminal.

The first terminal T1 is connected with the input terminal of the first inverter 10. The output terminal of the first inverter 10 is connected with the input terminal of the first transfer gate 20 and the second terminal T2. The second terminal T2 is referred to as a middle terminal. The middle terminal can be appropriately used when a function block of the logic circuit is formed using the logic cell. Kinds of the logical circuit function blocks which can be realized using the logic cells can be increased by providing the middle terminal. For example, an EXOR circuit to be described later with reference to FIGS. 7A and 7B can be simply formed.

The third terminal T3 is connected with the input terminal of the second inverter 11. The output terminal of the second inverter 11 is connected with the input terminal of the second transfer gate 21 and the fourth terminal T4. The fourth terminal T4 is referred to as a middle terminal like the above second terminal T2. The middle terminal can be appropriately used when a logic device is formed using the logic cells. Kinds of the logical function blocks which can be realized using the logic cells can be increased by providing the middle terminal. For example, the EXNOR circuit to be described later with reference to FIGS. 8A and 8B can be simply formed.

The fifth terminal T5 is connected with the input terminal of the third inverter 12, the first control input terminal of the first transfer gate 20, and the second control input terminal of the second transfer gate 21. The output terminal of the third inverter 12 is connected with the second control input terminal of the first transfer gate 20 and the first control input terminal of the second transfer gate 21.

The output terminal of the first transfer gate 20 and the output terminal of the second transfer gate 21 are connected with the sixth terminal T6.

Next, the operation of the logic cell with the structure described above will be described. The logic cell functions as a multiplexer basically. That is, when the signal of the low (L) level is supplied to the fifth terminal T5, the P channel MOS transistor and the N channel MOS transistor in the first transfer gate 20 are both turned on. Also, the P channel MOS transistor and the N channel MOS transistor in the second transfer gate 21 are both turned off. As a result, the signal supplied to the first terminal T1 is inverted by the first inverter 10 and is outputted from the sixth terminal T6 through the first transfer gate 20. On the other hand, when the signal of the high (H) level is supplied to the fifth terminal T5, the P channel MOS transistor and the N channel MOS transistor in the first transfer gate 20 are both turned off. Also, the P channel MOS transistor and the N channel MOS transistor in the second transfer gate 21 are both turned on. As a result, the signal supplied to the third terminal T3 is inverted by the second inverter 11 and is outputted from the sixth terminal T6 through the second transfer gate 21.

In above operation, either of the signal supplied to the first terminal T1 and the signal supplied to the third terminal T3 is inverted in accordance with the level of the signal supplied to the fifth terminal T5 and is outputted from the sixth terminal T6. Thus, the function of the inversion output-type multiplexer is realized.

As above described, the connection between the terminal T1 to T6, the first to third inverters 10 to 12, and the first and second transfer gates 20 and 21 in the logic cell is carried out in the logic cell by the lower wiring line layer. In this case, patterns of the terminal T1 to T6, a power supply wiring line pattern and a ground wiring line pattern are formed in the upper wiring line layer or the customized wiring line layer which is formed on the lower wiring line layer. In the upper wiring line layer, the wiring connection between the patterns of the terminals, the power supply wiring line pattern and the ground wiring line pattern is carried out in order to realize the logical function of the logic cell and the logic circuit designed by the user.

Next, when the wiring connection of the above-described logic cell is carried out in the upper wiring line layer, an arrangement example of the terminals, the ground wiring line pattern and the power supply wiring line pattern, which are formed in the logic cell will be described with reference to FIG. 3.

Figure 3:
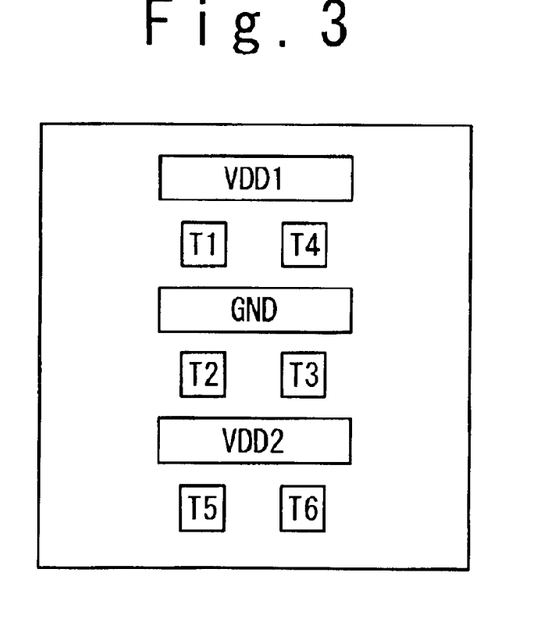
FIG. 3 is a diagram showing an arrangement example of a power supply wiring line pattern and a ground wiring line pattern and terminals in a logic cell used in a semiconductor device according to an embodiment of the present invention.

In an area of one logic cell, a first power supply wiring line pattern VDD1, a ground wiring line pattern GND and a second power supply wiring line pattern VDD2 are formed in this order like lands to have predetermined widths and lengths as accommodated in the area, as shown in FIG. 3. The first power supply wiring line pattern VDD1, the ground wiring line pattern GND and the second the power supply wiring line pattern VDD2 are provided in parallel to each other to have a same interval. It should be noted that the first power supply wiring line pattern VDD1 and the second the power supply wiring line pattern VDD2 are different in the arranged physical position and the same potential is given to them.

Also, the first terminal T1 and the fourth terminal T4 are provided between the first power supply wiring line pattern VDD1 and the ground wiring line pattern GND. Also, the second terminal T2 and the third terminal T3 are provided between the ground wiring line pattern GND and the second the power supply wiring line pattern VDD2. Moreover, the fifth terminal T5 and the sixth terminal T6 are provided on the side opposite to the second terminal T2 and third terminal T3 with respect to the second power supply wiring line pattern VDD2.

Each of the first terminal T1 to the fourth terminal T4 has a possibility that the terminal is connected with the power supply or the ground. It should be noted that the fifth terminal T5 is a terminal to which a signal is given from outside, and is generally not connected with the power supply or the ground. Also, the sixth terminal T6 is an output terminal and is never connected with the power supply or the ground. Therefore, the fifth terminals T5 and the sixth terminal T6 are provided in an edge of the area of the logic cell, i.e., between the second power supply wiring line pattern VDD2 and an end portion of the logic cell.

Next, an example when a logic circuit functional block is formed by using the logic cell having the above structure will be described.

Figure 5A:
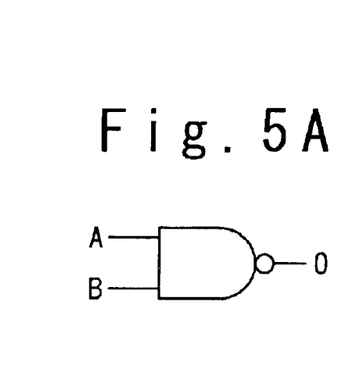
FIG. 5A is a diagram showing a NAND circuit.
Figure 5B:
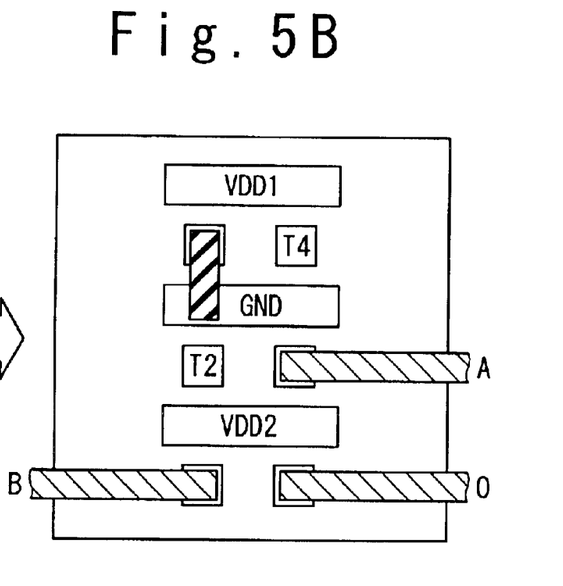
FIG. 5B is a diagram showing a pattern of the logic cell of the NAND circuit in the semiconductor device according to the embodiment of the present invention.

FIGS. 5A and 5B show an example when a NAND circuit is formed using the logic cell shown in FIG. 4. FIG. 3A shows a logic symbol of the NAND circuit, and FIG. 3B shows a wiring line pattern when the NAND circuit is formed. The NAND circuit is formed by connecting the first terminal T1 of the logic cell with the ground wiring line pattern GND (logic "0") and by opening the second terminal T2 and the fourth terminal T4. By the wiring line, the 2-input NAND circuit is realized in which the third terminal T3 (A) and the fifth terminal T5 are used as input terminals and the sixth terminal T6 is used as an output terminal (O). As shown in FIG. 5B, the NAND circuit can be formed by connecting the first terminal T1 with the adjacent ground wiring line pattern GND in a straight line. Therefore, the wiring line pattern is short. According to the NAND circuit formed in this way, a semiconductor device can be obtained to have excellent wiring workability and good electric characteristic in a semiconductor chip.

Figure 6A:
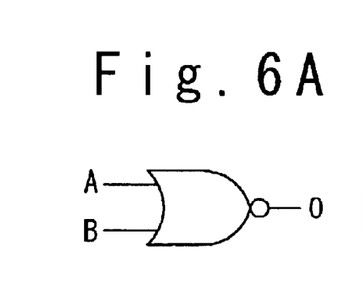
FIG. 6A is a diagram showing a NOR circuit.
Figure 6B:
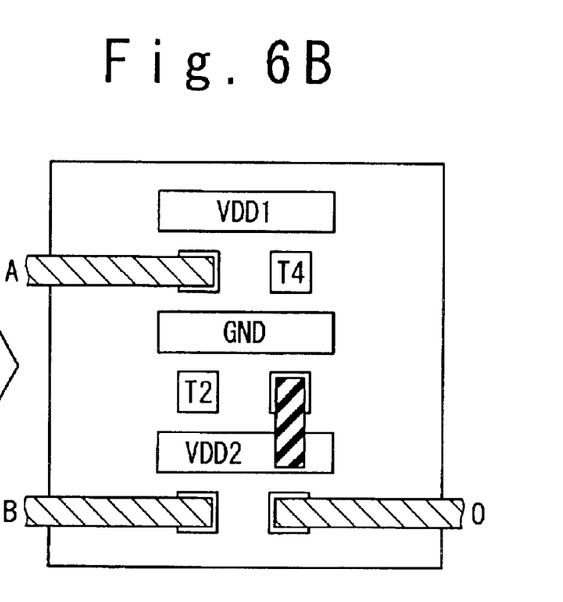
FIG. 6B is a diagram showing a pattern of the logic cell of the NOR circuit in the semiconductor device according to the embodiment of the present invention.

FIGS. 6A and 6B show an example when a NOR circuit is formed using the logic cell shown in FIG. 4. FIG. 4A shows a logic symbol of the NOR circuit, and FIG. 4B shows a wiring line pattern when the NOR circuit is formed. The NOR circuit is formed by connecting the third terminal T3 of the logic cell with the second power supply wiring line pattern VDD2 (logic "1") and by opening the second terminal T2 and the fourth terminal T4. By the wiring line, the 2-input NOR circuit can be realized to have the first terminal T1 (A) and the fifth terminal T5 (B) as input terminals and have the sixth terminal T6 as an output terminal (O). As shown in FIG. 6B, the NOR circuit can be formed by connecting the third terminal T3 with the adjacent second power supply wiring line pattern VDD2 in a straight line. Therefore, the wiring line pattern is short. According to the NOR circuit formed in the way, the semiconductor chip has excellent in the wiring workability and the good electric characteristic.

Figure 7A:
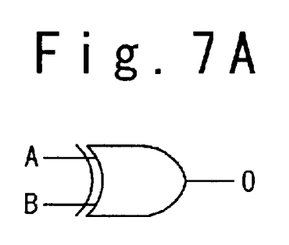
FIG. 7A is a diagram showing an EXOR circuit.
Figure 7B:
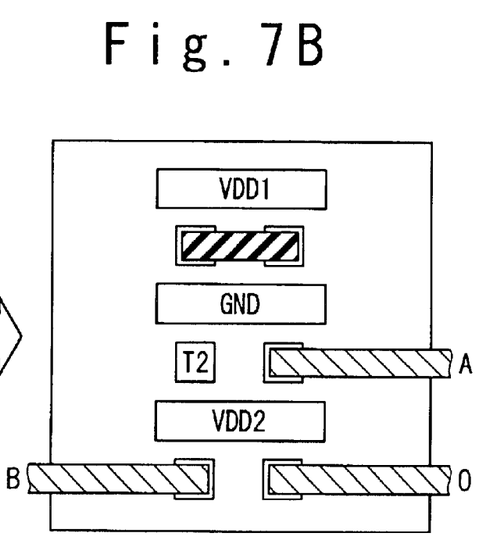
FIG. 7B is a diagram showing a pattern of the logic cell of the EXOR circuit in the semiconductor device according to the embodiment of the present invention.

FIGS. 7A and 7B show an example when an EXOR circuit is formed using the logic cell shown in FIG. 4. FIG. 7A shows a logic symbol of the EXOR circuit and FIG. 7B shows a wiring line pattern when the EXOR circuit is formed. The EXOR circuit is formed by connecting the first terminal T1 and the fourth terminal T4 in the logic cell and by opening the second terminal T2. By the wiring line, the 2-input EXOR circuit is realized to have the third terminal T3 (A) and the fifth terminal T5 (B) as input terminals and the sixth terminal T6 as an output terminal (O). As shown in FIG. 7B, the EXOR circuit can be formed by connecting only the first terminal T1 with the adjacent fourth terminal T4 in a straight line. Therefore, the wiring line pattern is short. According to the EXOR circuit formed in the way, the semiconductor chip is excellent in the wiring workability and the good electric characteristic.

Figure 8A:
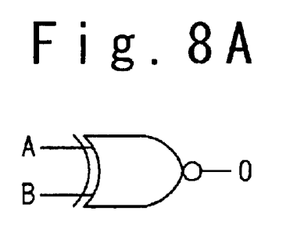
FIG. 8A is a diagram showing an EXNOR circuit.
Figure 8B:
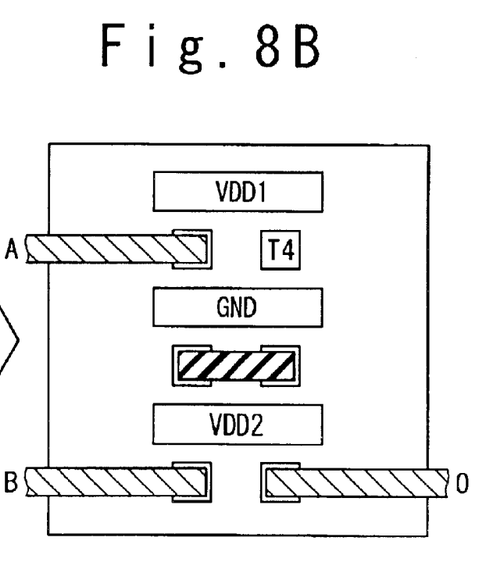
FIG. 8B is a diagram showing a pattern of the logic cell of the EXNOR circuit in the semiconductor device according to the embodiment of the present invention.

FIGS. 8A and 8B show an example when an EXNOR circuit is formed using the logic cell shown in FIG. 4. FIG. 8A shows a logic symbol of the EXNOR circuit and FIG. 8B shows a wiring line pattern when the EXNOR circuit is formed. The EXNOR circuit is formed by connecting the second terminal T2 and the third terminal T3 in the logic cell and by opening the fourth terminal T4. By the wiring line, the 2-input EXNOR circuit is realized to have the first terminal T1 (A) and the fifth terminal T5 (B) as input terminals and the sixth terminal T6 as an output terminal (O). As shown in FIG. 8B, the EXNOR circuit can be formed by connecting only the second terminal T2 with the adjacent third terminal T3 in a straight line. Therefore, the wiring line pattern is short. According with the EXNOR circuit formed in the way, the semiconductor chip is excellent in the wiring workability and the good electric characteristic.

The examples described above are a part of the logic circuit function blocks which can be realized using the logic cell with the structure of the multiplexer shown in FIGS. 3 and 4. In addition to the above, a latch and a flip-flop can be formed using a plurality of logic cells. Such examples are described in Japanese Patent Application No. 2000-319269 corresponding to U.S. application Ser. No. 09/978,721 and its divisional application, whose application number is not yet designated. The disclosure thereof is incorporated herein by reference.

As described above, the first terminal T1 and the fourth terminal T4 of the logic cell which have a possibility that they are connected with the power supply or the ground are provides between the first power supply wiring line pattern VDD1 and the ground wiring line pattern GND. Also, the second terminal T2 and the third terminal T3 are provided between the ground wiring line pattern GND and the second power supply wiring line pattern VDD2. Therefore, a logic circuit function block can be realized using the logic cell with the structure of the multiplexer by connecting each terminal with the power supply wiring line pattern or the ground wiring line pattern which is adjacent to the terminal in a straight wiring line pattern, or by connecting the adjacent terminals in a straight wiring line pattern. In other words, it is unnecessary to provide a bypassed wiring line pattern. Therefore, the wiring line pattern can be made short. As a result, the wiring workability at the formation of a wiring line pattern can be improved, and it is possible to decrease parasitic capacity due to the wiring line, resulting in the improved electric characteristic.

Also, the logic cell with the structure of the multiplexer is used as the logic cell. Also, the middle terminals drawn out from the internal element, i.e., the second terminal T2 and the fourth terminal T4 are provided. Therefore, the kinds of the logic circuit function blocks which can be realized based on the logic cell can be increased and the application range spreads.

As described above in detail, according to the present invention, a semiconductor device can be provided in which the wiring workability is improved and the electric characteristic can be improved and a manufacturing method for the same.

What is claimed is:

1. A semiconductor device comprising:
    a plurality of logic cells formed on a semiconductor substrate, wherein each of said plurality of logic cells has a circuit for a function block of a logic circuit; and
    a wiring layer which connects said plurality of logic cells to form said logic circuit function blocks and thereby said logic circuit,
    wherein said wiring layer comprises:
    a power supply wiring line pattern formed in a region corresponding to each of said plurality of logic cells;
    a ground wiring line pattern formed in said region; and
    a plurality of terminal patterns formed in said region, wherein each of said plurality of terminal patterns is connected with said circuit of said logic cell, and said plurality of terminal patterns are arranged adjacent to at least one of said power supply wiring line pattern and said ground wiring line pattern.

2. The semiconductor device according to claim 1, wherein said plurality of terminal patterns includes signal input terminal patterns, one or more of which are selectively opened depending on said logic circuit function block to be formed,
    said wiring layer further comprises:
    a pattern connecting each of remaining ones of said signal input terminal patterns to one of said power supply wiring line pattern, said ground wiring line pattern and another of said remaining signal input terminal patterns, depending on said logic circuit function block to be formed.

3. The semiconductor device according to claim 1, wherein ones of said plurality of terminal patterns to be connected each other depending on said logic circuit function block to be formed are arranged adjacent to each other.

4. The semiconductor device according to claim 1, wherein ones of said plurality of terminal patterns to be connected with said power supply wiring line pattern depending on said logic circuit function block to be formed are arranged adjacent to said power supply wiring line pattern.

5. The semiconductor device according to claim 1, wherein ones of said plurality of terminals to be connected with said ground wiring line pattern depending on said logic circuit function block to be formed are arranged adjacent to said ground wiring line pattern.

6. The semiconductor device according to claim 1, wherein said logic cell has a multi-purpose circuit as said circuit,
    said multi-purpose circuit comprises:
    a first inverter whose input is connected with a first terminal pattern of said plurality of terminal patterns, and whose output is connected with a second terminal pattern of said plurality of terminal patterns;
    a second inverter whose input is connected with a third terminal pattern of said plurality of terminal patterns and whose output is connected with a fourth terminal pattern of said plurality of terminal patterns;
    a third inverter whose input is connected with a fifth terminal pattern of said plurality of terminal patterns;
    a first transfer gate whose input is connected with the output of said first inverter, whose first control terminal is connected with the input of said third inverter and whose second control terminal is connected to an output of said third inverter; and
    a second transfer gate whose input is connected with the output of said second inverter, whose first control terminal is connected with the output of said third inverter and whose second control terminal is connected to the input of said third inverter,
    wherein an output of said first transfer gate and an output of said second transfer gate are connected to a sixth terminal pattern of said plurality of terminal patterns.

7. The semiconductor device according to claim 6, wherein said power supply wiring line pattern comprises a first power supply wiring line pattern and a second power supply wiring line pattern,
    said first terminal and said fourth terminal are arranged between said first power supply wiring line pattern and said ground wiring line pattern,
    said second terminal and said third terminal are arranged between said ground wiring line pattern and said second power supply wiring line pattern, and
    said fifth terminal and said sixth terminal are arranged between said second power supply wiring line pattern and an edge portion of said region.

8. The semiconductor device according to claim 7, wherein a NAND circuit is formed in which said first terminal pattern is connected with said ground wiring line pattern, and said second terminal pattern and said fourth terminal pattern have no connection such that said third terminal pattern and said fifth terminal pattern are set as inputs and said sixth terminal pattern is set as an output.

9. The semiconductor device according to claim 7, wherein a NOR circuit is formed in which said third terminal pattern is connected with said second power supply wiring line pattern, and said second terminal pattern and said fourth terminal pattern have no connection such that said first terminal pattern and said fifth terminal pattern are set as inputs and said sixth terminal pattern is set as an output.

10. The semiconductor device according to claim 7, wherein an EXOR circuit is formed in which said first terminal pattern is connected with said fourth terminal pattern, and said second terminal pattern has no connection such that said third terminal pattern and said fifth terminal pattern are set as inputs and said sixth terminal is set as an output.

11. The semiconductor device according to claim 7, wherein an EXNOR circuit is formed in which said second terminal pattern is connected with said third terminal pattern, and said fourth terminal pattern has no connection such that said first terminal pattern and said fifth terminal pattern are set as inputs and said sixth terminal pattern is set as an output.

\* \* \* \* \*